(12) United States Patent
Anderson et al.

(10) Patent No.: US 7,282,772 B2
(45) Date of Patent: Oct. 16, 2007

(54) LOW-CAPACITANCE CONTACT FOR LONG GATE-LENGTH DEVICES WITH SMALL CONTACTED PITCH

(75) Inventors: Brent A. Anderson, Jericho, VT (US); Edward J. Nowak, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 11 days.

(21) Appl. No.: 11/275,513

(22) Filed: Jan. 11, 2006

(65) Prior Publication Data

US 2007/0158762 A1    Jul. 12, 2007

(51) Int. Cl.
H01L 29/76    (2006.01)
(52) U.S. Cl. .............. 257/386; 257/401; 257/E29.136
(58) Field of Classification Search ........... 257/202, 257/368, 386, 401, E29.136
See application file for complete search history.

(56) References Cited

U.S. PATENT DOCUMENTS

| | | | |
|---|---|---|---|
| 4,306,246 A | | 12/1981 | Davies et al. |
| 4,996,574 A | * | 2/1991 | Shirasaki ................ 257/66 |
| 5,744,843 A | | 4/1998 | Efland et al. |
| 6,204,542 B1 | * | 3/2001 | Kinoshita et al. ........... 257/401 |
| 6,864,519 B2 | | 3/2005 | Yeo et al. |
| 6,911,701 B2 | * | 6/2005 | Arima ................ 257/368 |
| 7,057,239 B2 | * | 6/2006 | Hirotsu et al. ........... 257/366 |
| 7,078,775 B2 | * | 7/2006 | Yi et al. .................. 257/401 |
| 2004/0169269 A1 | | 9/2004 | Yeo et al. |
| 2005/0127362 A1 | | 6/2005 | Zhang et al. |
| 2006/0228862 A1 | * | 10/2006 | Anderson et al. ......... 438/279 |

* cited by examiner

*Primary Examiner*—T. N. Quach
(74) *Attorney, Agent, or Firm*—Gibb & Rahman, LLC; William D. Sabo, Esq.

(57) ABSTRACT

Disclosed are planar and non-planar field effect transistor (FET) structures and methods of forming the structures. The structures comprise segmented active devices (e.g., multiple semiconductor fins for a non-planar transistor or multiple semiconductor layer sections for a planar transistor) connected at opposite ends to source/drain bridges. A gate electrode is patterned on the segmented active devices between the source/drain bridges such that it has a reduced length between the segments (i.e., between the semiconductor fins or sections). Source/drain contacts land on the source/drain bridges such that they are opposite only those portions of the gate electrode with the reduced gate length. These FET structures can be configured to simultaneously maximize the density of the transistor, minimize leakage power and maintain the parasitic capacitance between the source/drain contacts and the gate conductor below a preset level, depending upon the performance and density requirements.

4 Claims, 8 Drawing Sheets

LOW-CAPACITANCE CONTACT FOR LONG GATE-LENGTH DEVICES WITH SMALL CONTACTED PITCH

BACKGROUND

1. Field of the Invention

The embodiments of the invention generally relate to field effect transistors, and, more particularly, to a low-capacitance contact for long gate-length planar and non-planar devices with small contacted pitch.

2. Description of the Related Art

Despite current lithography techniques which allow devices to be formed with reduced dimensions, the scaling of complementary metal oxide semiconductor (CMOS) devices and particularly, the scaling of CMOS transistor gate lengths is limited by leakage power. Logic circuit density is limited by the contacted pitch of field effect transistors (i.e., the minimum metal line width spacing plus addition for via or contact covers or landing pads) and this contacted pitch is in turn limited by the (non-shrinking) gate lengths of the transistors. It would be advantageous over the prior art to provide a transistor structure that can simultaneously minimize leakage power, minimize parasitic capacitance between the source/drain contacts and the gate electrode and optimize device density.

SUMMARY

In view of the foregoing, embodiments of the invention provide planar and non-planar field effect transistor (FET) structures and methods of forming the structures. The structures comprise segmented active devices (e.g., multiple semiconductor fins for a non-planar transistor or multiple semiconductor layer sections for a planar transistor) connected at opposite ends to source/drain bridges. A gate electrode is patterned on the segmented active devices between the source/drain bridges such that it has a reduced length between the segments (i.e., between the semiconductor fins or sections). Source/drain contacts land on the source/drain bridges such that they are opposite only those portions of the gate electrode with the reduced gate length. These FET structures can be configured to simultaneously maximize the density of the transistor, minimize leakage power and maintain the parasitic capacitance between the source/drain contacts and the gate conductor below a preset level, depending upon the performance and density requirements.

More particularly, one embodiment of the FET of the invention comprises a planar FET. This planar FET can comprise a semiconductor layer with a plurality of first sections and a plurality of second sections. The second sections can traverse and contact the first sections. Specifically, the first sections can be positioned parallel to each other, the second sections can be positioned parallel to each other and the first sections can be positioned perpendicular to the second sections such that spaces are formed between the sections. These spaces can be insulator-filled, the first sections can comprise the channel regions of the transistor and the second sections can comprise source/drain diffusion regions.

A gate conductor can be positioned between the second sections and can extend across the first sections and the spaces (e.g., parallel to the second sections). The gate conductor can be patterned such that it comprises first portions above the first sections and second portions above the spaces. The first portions can have a first length that is greater than a second length of the second portions. For example, the length of the first portions can range from approximately 1.2 to 2.5 times longer than the length of the second portions. A gate dielectric layer can be positioned between the first sections and the gate conductor.

A plurality of source/drain contacts can connect to the second sections. The contacts can be positioned above the second sections between the first sections such that they are opposite the second (shorter) portions of the gate conductor. The different lengths of the gate conductor and a pitch between the contacts can be predetermined based on performance and density requirements for the transistor so as to simultaneously maximize the density the transistor, minimize leakage power and maintain parasitic capacitance below a preset level.

Other embodiments of the FET of the invention comprise non-planar FETs, such as finFETs or trigate FETs. Each of these non-planar FETs can comprise a plurality of semiconductor fins and a plurality of semiconductor mesas on the substrate. The semiconductor mesas can traverse and contact the semiconductor fins. Specifically, the semiconductor fins can be positioned parallel to each other, the semiconductor mesas can be positioned parallel to each other and the semiconductor fins can be positioned perpendicular to the semiconductor mesas such that a plurality of spaces are between the semiconductor fins. The semiconductor fins can have a height to width ratio of approximately 2:3 to 3:2 so that the non-planar FET is configured as a trigate FET. Alternatively, the semiconductor fins can have a height to width ratio of greater than approximately of 4:1 so that the non-planar FET is configured as a fin-type or double-gate FET. Additionally, the semiconductor fins can comprise the channel regions of the transistor and the semiconductor mesas can comprise source/drain diffusion regions.

A gate conductor can be positioned between the semiconductor mesas and can extend across the semiconductor fins and the spaces (e.g., parallel to the semiconductor mesas). The gate conductor can be patterned such that it comprises first portions over the semiconductor fins (i.e., above the channel regions) and second portions over the spaces. The first portions can have a first length that is greater than the second length of the second portions. For example, the length of the first portions (i.e., the first length) can range from approximately 1.2 to 2.5 times longer than the length of the second portions (i.e., the second length).

A gate dielectric layer can be positioned between the semiconductor fins and the gate conductor (i.e., on the opposing sidewalls and top surface of the fin-shaped semiconductor fins below the gate conductor). This gate dielectric layer can comprise a first region on the top surface and a second region on the opposing sidewalls. The first region can have the same thickness and can comprise the same dielectric material as the second region. Alternatively, the first region can have a different thickness and/or can comprise a different dielectric material than the second region.

A plurality of source/drain contacts can connect to the semiconductor mesas. The contacts can be positioned above the semiconductor mesas between the semiconductor fins such that they are opposite the second (shorter) portions of the gate conductor. As with the previously described planar embodiment, the different lengths of the gate conductor and a pitch between the contacts are predetermined based on performance and density requirements for the transistor in order to simultaneously maximize the density of transistor, minimize leakage power and maintain parasitic capacitance below a preset level.

One embodiment of the method of the invention comprises forming a planar FET, as described above. Specifically, a semiconductor layer with a plurality of second sections that traverse and contact a plurality of first sections is formed on a substrate. The semiconductor layer is formed such that the first sections and the second sections are separated by spaces that are filled with an insulator. For example, the semiconductor layer can be patterned with the first sections parallel to each other, the second sections parallel to each other and the first sections perpendicular to the second sections such that spaces are formed between the sections.

A gate dielectric layer can be formed on the first sections and a gate conductor can be formed on the gate dielectric layer. Specifically, the gate conductor can be patterned on the semiconductor layer between the second sections (e.g., parallel to the second sections) such that it extends across the first sections and the spaces. The gate conductor can further be patterned with first portions above the first sections and second portions above the spaces. More particularly, the first portions can be patterned with a first length that is greater than a second length of the second portions. For example, the gate conductor can be formed such that the first length is approximately 1.2 to 2.5 times longer than the second length.

A plurality of source/drain contacts can also be formed to the second sections. Specifically, these contacts can be formed above the second sections between the first sections such that they are opposite the second (shorter) portions of the gate conductor.

In order to simultaneously maximize the density of the resulting transistor, minimize leakage power and maintain parasitic capacitance below a preset level, the different lengths of the gate conductor and a pitch between the contacts can be predetermined (e.g., during the design phase before forming the semiconductor layer) based on performance and density requirements.

Another embodiment of the method of the invention comprises forming the non-planar FETs, as described above. Specifically, a plurality of semiconductor fins and a plurality of semiconductor mesas (i.e., semiconductor regions can be formed on an insulator layer. In order to configure the transistor as a trigate FET, these semiconductor bodies can be formed with a height to width ratio of approximately 2:3 to 3:2. Alternatively, in order to form the transistor as a fin-FET, these semiconductor bodies can be formed with a height to width ratio that is greater than approximately 4:1. Additionally, these semiconductor bodies are formed such that the semiconductor mesas traverse and contact the semiconductor fins and such that the semiconductor fins and the semiconductor mesas are separated by spaces. For example, the semiconductor bodies can be lithographically patterned with first sections parallel to each other, with second sections parallel to each other and with the first sections perpendicular to the second sections such that spaces are formed between the sections A gate dielectric layer can be formed on the semiconductor fins and a gate conductor can formed on the gate dielectric layer. Specifically, the gate dielectric layer can be formed with a first region on the top surface of the semiconductor fins and a second region on the opposing sidewalls of the semiconductor fins. The first region can be formed with the same thickness and the same dielectric material as the second region. Alternatively, the first region can be formed with at least one of a different thickness and a different dielectric material than the second region.

The gate conductor can be patterned over the gate dielectric material on the semiconductor fins between the semiconductor mesas (e.g., parallel to the mesa sections) such that it extends across the semiconductor fins and the spaces. The gate conductor can further be patterned with first portions above the semiconductor fins and second portions above the spaces. More particularly, the first portions can be patterned with a first length that is greater than a second length of the second portions. For example, the gate conductor can be formed such that the first length is approximately 1.2 to 2.5 times longer than the second length.

A plurality of contacts can be formed to the semiconductor mesas. Specifically, these contacts can be formed above the semiconductor mesas between the semiconductor fins such that they are opposite the second (shorter) portions of the gate conductor.

In order to simultaneously maximize the density of the resulting transistor, minimize leakage power and maintain parasitic capacitance below a preset level, the different lengths of the gate conductor and a pitch between the contacts can be predetermined (e.g., during the design phase before forming of the semiconductor bodies) based on performance and density requirements for the transistor.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
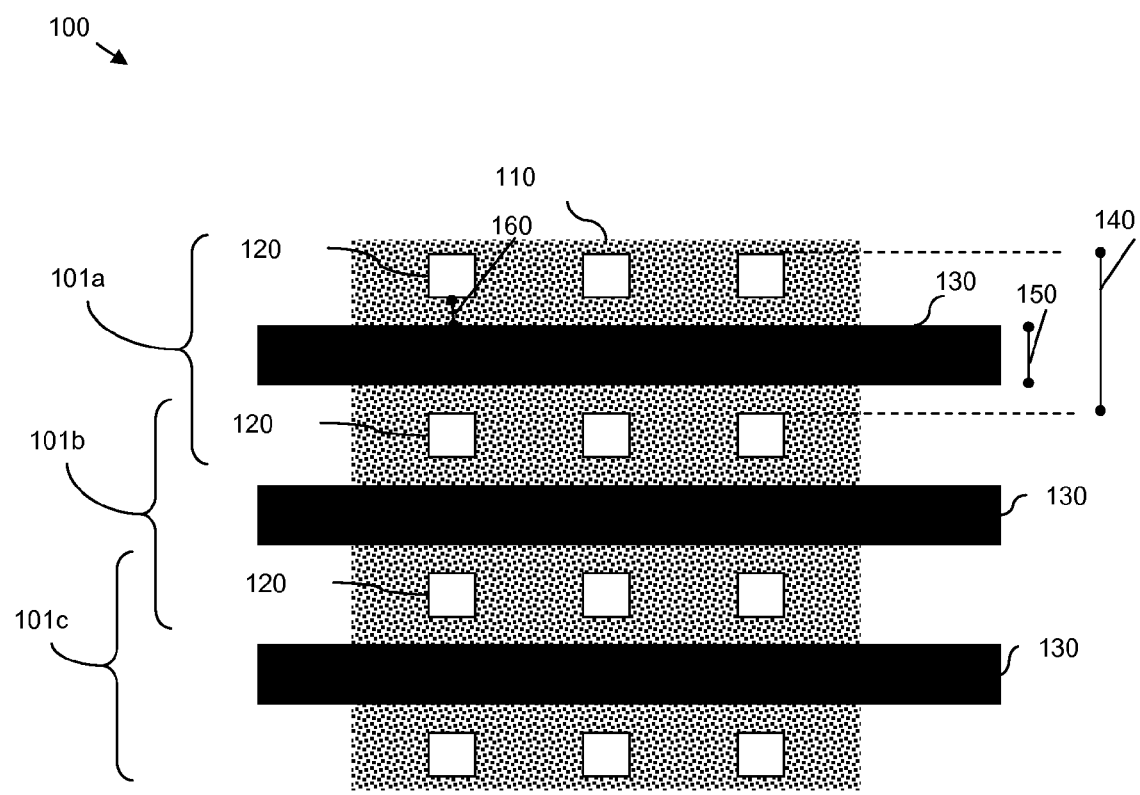
FIG. 1 is schematic diagram illustrating a top view of a field effect transistor.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

FIG. 1 illustrates semiconductor structure 100 comprising multiple planar field effect transistors 101a-c. More specifically, the structure 100 comprises multiple gate conductors 130 that extend across a semiconductor layer 110. Shared source/drain contacts are disposed between the gate conductors 130 and contact the semiconductor layer 110.

As mentioned above, logic circuit density (e.g., the density of the structure 100) is limited by the contacted pitch 140 of field effect transistors 101a-c. This contacted pitch 140 is in turn limited by the (non-shrinking) gate lengths 150 of the transistors 101a-c. Specifically, the contacted pitch 140 is the spacing between corresponding points on contacts 120 located on opposite sides of the gate conductor 130. The contacted pitch 140, therefore, includes both the gate length 150 and the distances 160 between the gate conductor 130 the source/drain contacts 120. However, scaling of the gate length 150 is limited due to resulting leakage power and scaling of the distance 160 between the gate conductor and the source/drain contacts is limited due to parasitic capacitance which degrades performance and increases the closer the source/drain contacts 120 are to the gate conductor 130. Therefore, it would be advantageous over the prior art to provide a transistor structure that can be use to minimize parasitic capacitance between the source/drain contacts and the gate electrode, minimize leakage power and maximize device density.

In view of the foregoing, embodiments of the invention provide planar and non-planar field effect transistor (FET) structures and methods of forming the structures. The structures are made up of segmented active devices (e.g., multiple semiconductor fins for a non-planar transistor or multiple semiconductor layer sections for a planar transistor) connected at opposite ends to source/drain bridges. A gate electrode is patterned on the segmented active devices between the source/drain bridges such that it has a reduced length between the segments (i.e., between the semiconductor fins or sections). Source/drain contacts land on the source/drain bridges such that they are opposite only those portions of the gate electrode with the reduced gate length. These FET structures can be configured to simultaneously maximize the density of the transistor, minimize leakage power and maintain the parasitic capacitance between the source/drain contacts and the gate conductor below a preset level, depending upon the performance and density requirements.

Figure 2:
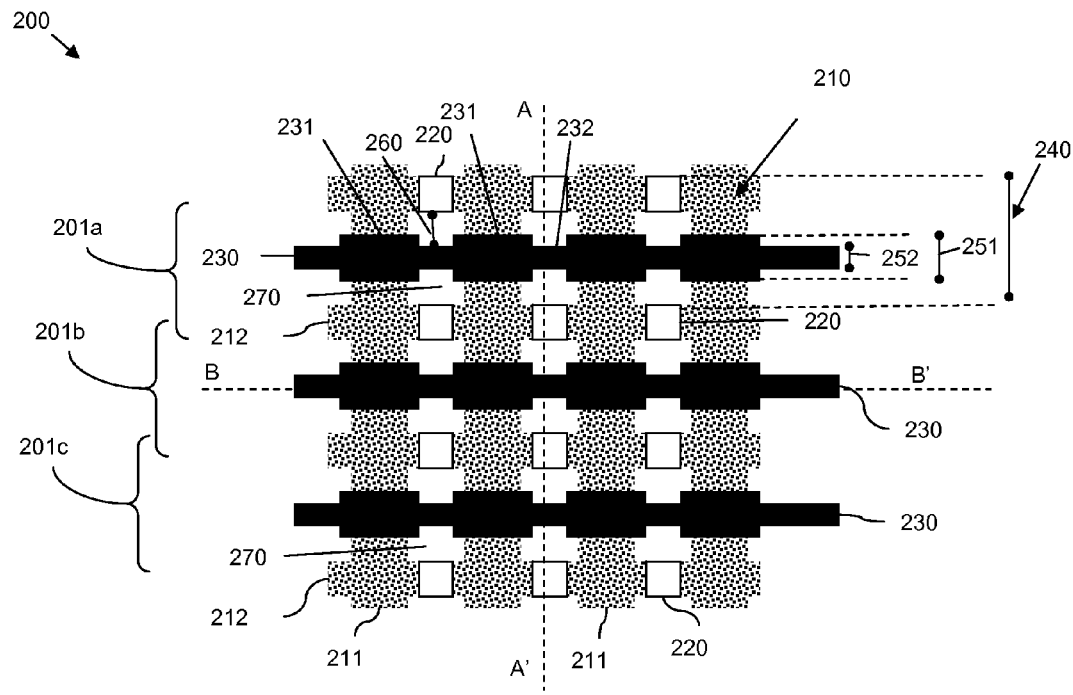
FIG. 2 is a schematic diagram illustrating a top view of an embodiment of the field effect transistor of the invention.
Figure 3:
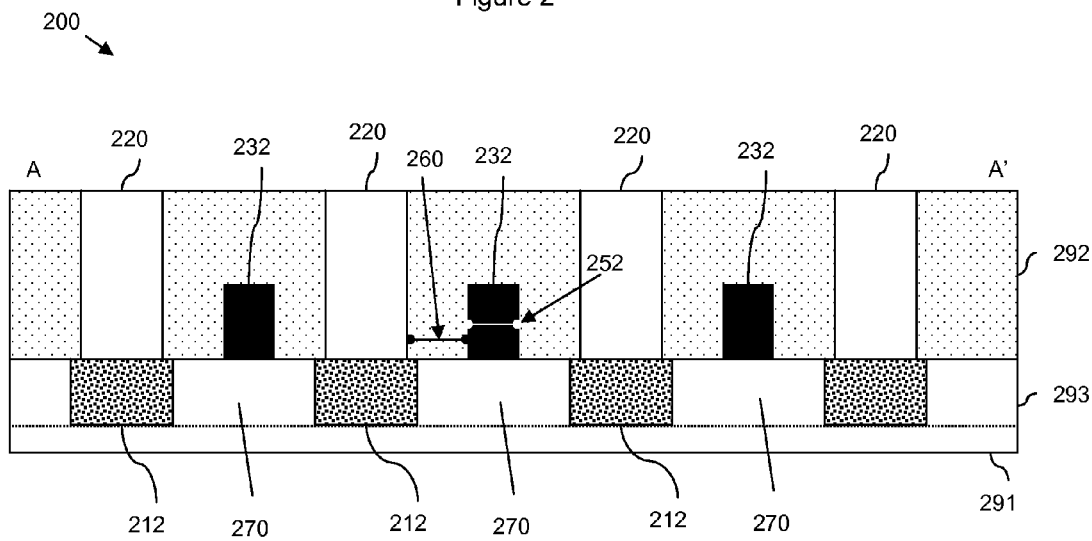
FIG. 3 is a schematic diagram illustrating a cross-section view of the transistor of FIG. 2.
Figure 4:
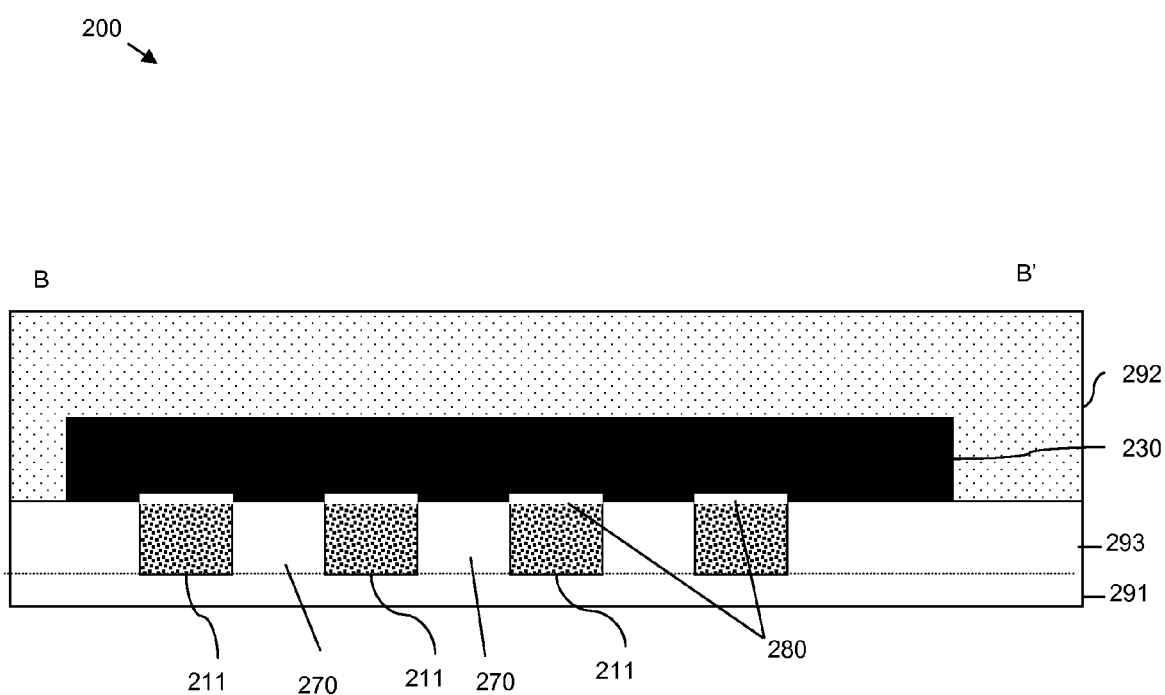
FIG. 4 is a schematic diagram illustrating another cross-section view of the transistor of FIG. 2.

FIGS. 2-4 illustrate a top view and various cross-section views (e.g., cross-section A-A' and B-B'), respectively, of one embodiment of the FET of the invention. Specifically, referring to FIG. 2, the semiconductor structure 200 comprises a plurality of planar FETs 201a-c. Each planar FET 201a-c can comprise a semiconductor layer 210 with a plurality of first sections 211 and at least two second sections 212. The second sections 212 can traverse and contact the first sections 211. Specifically, the first sections 211 can be positioned parallel to each other, the second sections 212 can be positioned parallel to each other and the first sections 211 can be positioned perpendicular to the second sections 212 such that spaces 270 (e.g., rectangular-shaped spaces) are formed between the sections 211, 212, as illustrated in FIG. 2. The spaces 270 can be filled by an insulator (e.g., $SiO_2$).

For each transistor 201, a gate conductor 230 can be positioned between two second sections 212 and can extend across the first sections 211 and the spaces 270 (e.g., parallel to the two second sections 212) (see also the cross-sections of FIGS. 3 and 4). The gate conductor 230 can be patterned such that it comprises first portions 231 above the first sections 211 and second portions 232 above the spaces 270 between the first and seconds sections. The first portions 231 can have a first length 251 that is greater than a second length 252 of the second portions 231. For example, the length 251 of the first portions 231 can range from approximately 1.2 to 2.5 times longer than the length 252 of the second portions 232. A gate dielectric layer 280 (see FIG. 4) can be positioned between the first sections 211 and the gate conductor 230 (i.e., on the top surface of the first sections 211).

Thus, the portions of the first sections 211 below the gate conductor 230 form the channel regions of the transistor 201 and the second sections 212 form source/drain diffusion regions (i.e., source/drain bridges). The second sections 212 can further be used as shared source/drain diffusion regions for multiple transistors 201a-c. Additionally, it is anticipated that while the structure 200, as illustrated in FIGS. 2-4, comprises multiple planar transistors 201a-c, a gate conductor bridge can be incorporated into the structure 200 such that it extends across and connects each of the multiple gate conductors 230 in order to form a single planar FET, according to the invention.

A plurality of source/drain contacts 220 can connect to the second sections 212 (i.e., to the source/drain bridges) on each side of the gate conductor 230 (see also the cross-section of FIG. 3). The contacts 220 can be positioned above the second sections 212 between the first sections 211 such that they are opposite the second (shorter) portions 232 and not adjacent to the first (longer) portions 231 of the gate conductor 230.

Consequently, during the design of the planar transistor 201 of the invention a trade-off can be made between minimizing parasitic capacitance and leakage power and optimizing device density. Specifically, forming the gate conductor 230 with longer and shorter portions 231, 232, as described above, allows a designer to reduce parasitic capacitance without decreasing the gate length 251 over the active silicon regions of the first sections 211 (causing an increase in leakage power) and without further increasing the contacted pitch 240. Alternatively, forming the gate conductor 230, as described above, allows the device density to be increased by decreasing the distance 260 between the contacts and the shorter portions 232 of the gate conductor 230 without reducing the gate length 251 over the active silicon regions (causing an increase in leakage power) and without significantly increasing parasitic capacitance. Therefore, the different lengths 251-252 of the gate conductor 230 and a pitch 240 between the contacts 320 (i.e., a contacted pitch) can be predetermined so as to simultaneously maximize the density of the transistor, minimize leakage power, and maintain any parasitic capacitance (e.g., between the contacts and the gate conductor) below a preset level, as dictated by density and performance requirements.

FIGS. 5-10 illustrate a top view and various cross-section views (e.g., cross-section A-A', B-B' and C-C'), respectively, of another embodiment of the FET of the invention. Specifically, referring to FIG. 5, the semiconductor structure 300 comprises a plurality of multi-gated non-planar FETs 301a-c, such as finFETs or trigate FETs. Such multi-gated non-planar field effect transistors (FETs) were developed to provide scaled devices with faster drive currents and reduced short channel effects over planar FETs. FinFETs are non-planar transistors in which the channel region is formed at the center of a thin semiconductor fin with the source/drain regions at opposing ends. Due to the height to width ratio of the finFET fin, the gates are effective only on the opposing sidewalls of the fin and not the top surface. Trigate FETs have a similar structure to that of finFETs; however, the fin height to width ratio is such that the gates are effective on three sides of the channel region, including the top surface and the opposing sidewalls.

Thus, each of these non-planar FETs 301a-c can comprise a plurality of fin-shaped semiconductor bodies (fins) 311 and at least two semiconductor mesas 312 (e.g., source/drain bridges) on a substrate 391. The semiconductor mesas 312 can traverse and contact the semiconductor fins 311. Specifically, the semiconductor fins 311 can be positioned parallel to each other, the semiconductor mesas 312 can be positioned parallel to each other and the semiconductor fins 311 can be positioned perpendicular to the semiconductor mesas 312. A plurality of spaces 370 (e.g., rectangular-shaped spaces) separate the semiconductor bodies 311, 312 (see also the cross-sections of FIGS. 6 and 7). For trigate FETs, the semiconductor fins 311 can have a height 313 to width 314 ratio of approximately 2:3 to 3:2. Alternatively, for fin-FETs, the semiconductor fins 311 can have a height 313 to width 314 ratio of greater than approximately of 4:1.

Figure 6:
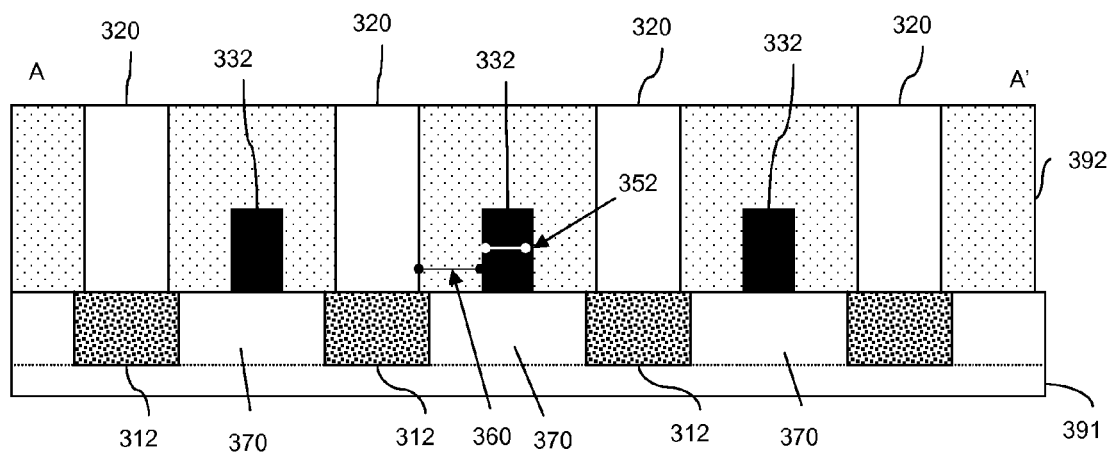
FIG. 6 is a schematic diagram illustrating a cross-section view of the transistor of FIG. 5.
Figure 7:
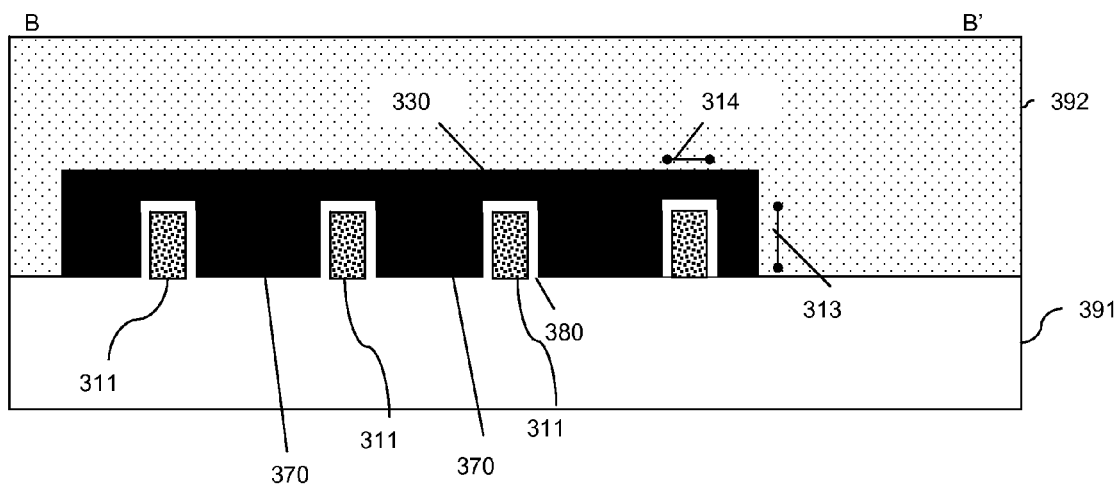
FIG. 7 is a schematic diagram illustrating another cross-section view of the transistor of FIG. 5.
Figure 8:
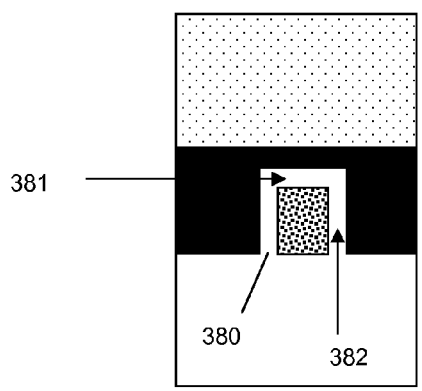
FIGS. 8 and 9 are exploded views of alternate configurations for a portion of FIG. 7.
Figure 9:
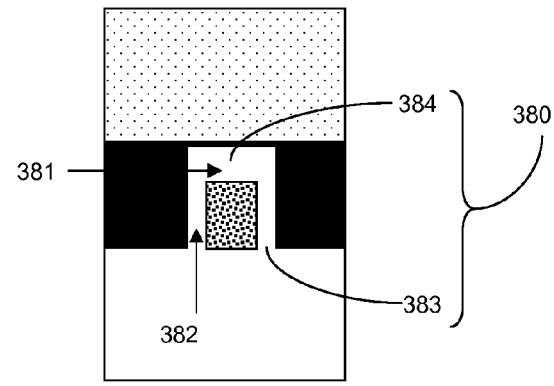

For each transistor 301a-c, a gate conductor 330 can be positioned between two semiconductor mesas 312 and can extend across the semiconductor fins 311 and the spaces 370 (e.g., parallel to the semiconductor mesas 312) (see the cross-sections of FIGS. 6 and 7). The gate conductor 330 can be patterned such that it comprises first portions 331 over the semiconductor fins 311 (i.e., adjacent to the top surface and opposing sidewalls of the fins) and second portions 332 over the spaces 370. The first portions 331 can have a first length 351 that is greater than the second length 352 of the second portions 332. For example, the length 351 of the first portions 331 can range from approximately 1.2 to 2.5 times longer than the length 352 of the second portions 332. Those skilled in the art will recognize that, unlike in the planar embodiment described above, gate critical dimension down the semiconductor fin 331 is in the vertical direction so rounding associated with this PC pattern is not problematic.

A gate dielectric layer 380 can be positioned between the semiconductor fins 311 and the gate conductor 330 (i.e., on the top surface and opposing sidewalls) (see FIG. 7). This gate dielectric layer 380 can comprise a first region 381 on the top surface and a second region 382 on the opposing sidewalls. The first region 381 can have the same thickness and can comprise the same dielectric material as the second region 382 (see FIG. 8). Alternatively, the first region 381 can have a different thickness and/or can comprise a different dielectric material (e.g., an oxide and a nitride, respectively) than the second region 382 (see FIG. 9). The thickness and the dielectric materials can be varied in tri-gate FETs in order to tune drive current.

Thus, the portion of the semiconductor fins 311 below the gate conductor 330 forms the channel regions of the transistor and the semiconductor mesas 312 form the source/drain diffusion regions (i.e., source/drain bridges) of the transistor. The semiconductor mesas 312 can further be used as shared source/drain diffusion regions for multiple transistors 301a-c. Additionally, it is anticipated that while the structure 300, as illustrated, comprises multiple planar transistors 301a-c, a gate conductor bridge can be incorporated into the structure 300 such that it extends across and connects each of the multiple gate conductors 330 to form a single non-planar FET, according to the invention.

A plurality of contacts 320 can connect to the semiconductor mesas 312 (i.e., to the source/drain bridges). The contacts 320 can be positioned above the semiconductor mesas 312 between the semiconductor fins 311 such that they are opposite the second (shorter) portions 332 (see the cross-section of FIG. 6) and not adjacent to the first (longer) portions 331 of the gate conductor 330 (see the cross-section of FIG. 10).

Consequently, during the design of the non-planar transistor of the invention a trade-off can be made between minimizing parasitic capacitance and leakage power and maximizing device density. Specifically, forming the gate conductor 330 with longer and shorter portions 331, 332, as described above, allows a designer to reduce parasitic capacitance without decreasing the gate length 351 over the active silicon regions of the semiconductor fins 311 (causing an increase in leakage power) and without further increasing the contacted pitch 340. Alternatively, forming the gate conductor 330, as described above, allows the device density to be increased by decreasing the distance 360 between the contacts and the shorter portions 332 of the gate conductor 330 without reducing the gate length 351 over the active silicon regions (causing an increase in leakage power) and without significantly increasing parasitic capacitance. Therefore, the length 352 of the gate conductor 330 over the spaces 370, the distance 360 between the contacts 320 and the gate conductor 330 and a pitch 340 between the contacts 320 (i.e., a contacted pitch) can be predetermined so as to simultaneously maximize the density of the transistor, minimize leakage power and maintain any parasitic capacitance (e.g., between the contacts and the gate conductor) below a preset level as dictated by device density and performance requirements.

Figure 11:
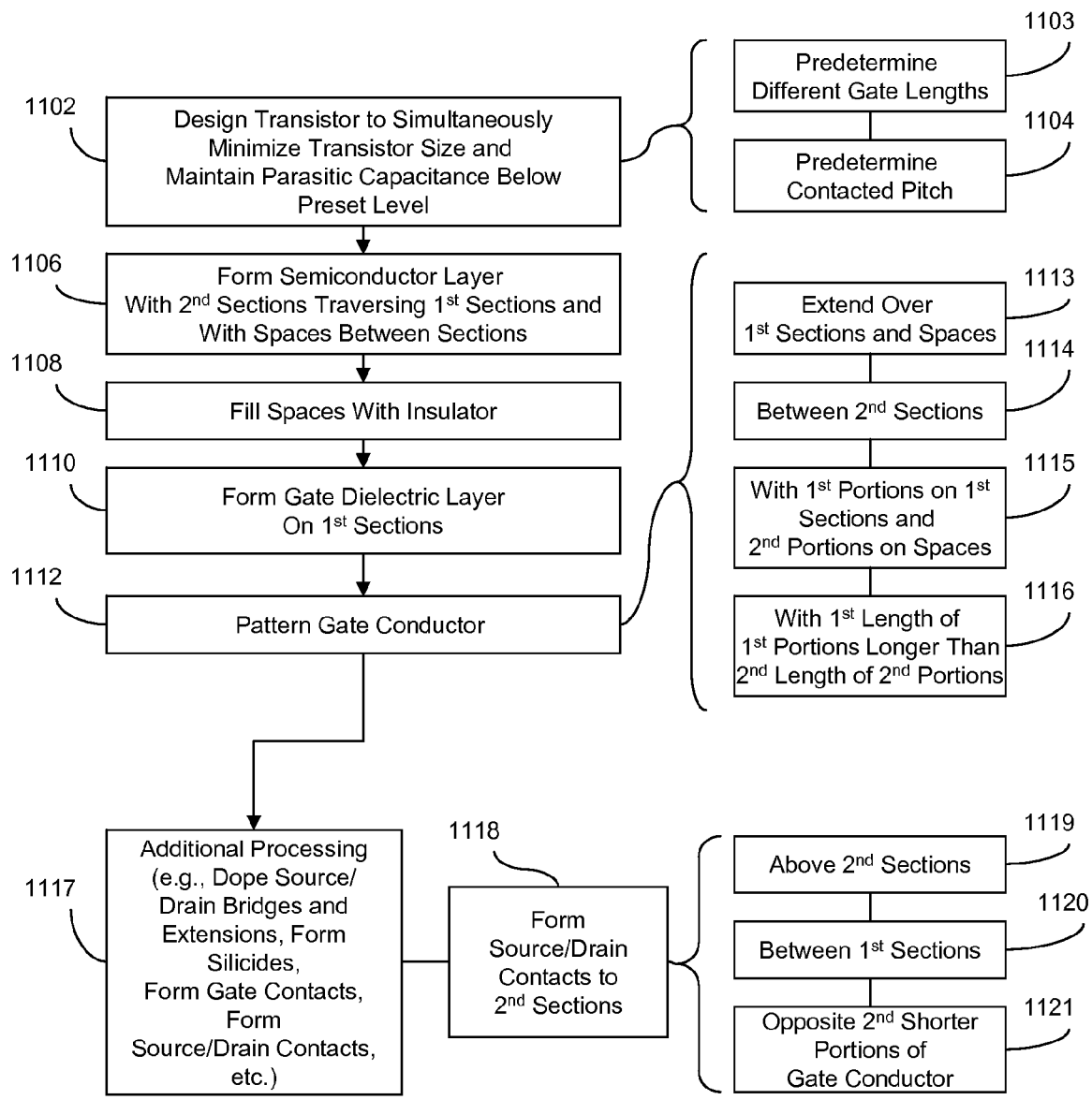
FIG. 11 is a flow diagram illustrating an embodiment of the method of the invention.

Referring to FIG. 11 in combination with FIG. 2, one embodiment of the method comprises forming a planar FET 201. The transistor 201 is designed to simultaneously maximize transistor density, minimize leakage power and maintain the parasitic capacitance (e.g., between source/drain contacts 220 and the gate conductor 230) below a preset level (1102), as dictated by performance and density requirements. This is accomplished by predetermining different lengths 251, 252 of the gate conductor 230 over different sections of the FET (1103) and predetermining the pitch 240 between the contacts 220 (1104), as described in greater detail below. Then, the transistor 201 is formed using conventional planar FET processing techniques. Specifically, a semiconductor layer 210 with a plurality of second sections 212 (at least two second sections) that traverse and contact a plurality of first sections 211 is formed on a dielectric substrate 291 (e.g., a buried oxide layer of a silicon-on-insulator (SOI) wafer or bulk silicon wafer) (1106). The semiconductor layer 210 is formed such that the first sections 211 and the second sections 212 are separated by insulator-filled spaces 270. For example, a semiconductor layer 210 of a silicon-on-insulator (SOI) or bulk silicon wafer can be lithographically patterned with the first sections 211 parallel to each other, with the second sections 212 parallel to each other and with the first sections 211 perpendicular to the second sections 212, such that spaces 270 (e.g., rectangular-shaped spaces) are formed between the sections 211, 212 (1106). These spaces 270 can be filled with an insulator 293, such as $SiO_2$, for example, by depositing and planarizing the insulator (1108)

A gate dielectric layer 280 can be formed (e.g., grown or deposited) on the first sections 211 (1110) and a gate conductor 230 can be formed on the gate dielectric layer 280 (1112). Specifically, a gate conductor 230 can be lithographically patterned onto the semiconductor layer 210 such that it is positioned between the two second sections 212 (e.g., parallel to the second sections 212) and such that it extends across the first sections 211 and the spaces 270 (1113-1114) (see also the cross-sections of FIGS. 3 and 4). The gate conductor 230 can further be patterned with first portions 231 above the first sections 211 and second portions 232 above the spaces 270 (1115). More particularly, the first portions 231 can be patterned with a first length 251 that is greater than a second length 252 of the second portions 232 (1116). For example, the gate conductor 230 can be patterned such that the first length 251 is approximately 1.2 to 2.5 times longer than the second length 252.

Additional processing can be performed in conjunction with the above-described processes, in order to complete the planar FET of this embodiment (1117). This additional processing may include, but is not limited to: doping the source/drain bridges (i.e., the second sections 212); doping the source/drain extensions (i.e., the areas of first sections 211 between the gate conductor 230 and the second sections 212); forming halos; forming spacers on the gate sidewalls; forming silicides (e.g., Co, Ni, Etc.) on the top surface of the first sections 211, the second sections 212, and/or the gate conductor 230 (if the gate conductor is formed with a polysilicon material and without a cap); depositing and planarizing an additional dielectric layer 292; forming gate contacts; and forming the source/drain contacts 220 (i.e., the contacts 220 to the second sections 212, as described above).

Specifically, a plurality of source/drain contacts 220 can be formed to the second sections 211 (1118) (see also the cross section of FIG. 3). These contacts 220 can be formed above the second sections 212 (1119) between the first sections 211 (1120) such that they are opposite the second (shorter) portions 232 (see the cross-section of FIG. 3) and particularly not adjacent to the second (longer) portions 231 of the gate conductor 230 (1121) (see the cross-section of FIG. 4).

As mentioned above (at process 1102), the different lengths 251-252 of the gate conductor 230 and a pitch 240 between the contacts 220 (i.e., a contacted pitch) can be predetermined based on a trade-off between performance and density requirements for the transistor 201 so as to simultaneously maximize the density of the transistor, minimize leakage power and maintain any parasitic capacitance (e.g., between the contacts and the gate conductor) below a preset level. For example, the lengths 251 and 252 of the gate conductor 230 and the pitch 240 can be predetermined during the design phase (1102) to reduce parasitic capacitance without reducing the gate length 251 of over the active silicon regions (causing an increase in leakage power) and without further increasing the contacted pitch 240. Alternatively, the lengths 251 and 252 of the gate conductor 230 and the pitch 240 can be predetermined to allow the device density to be increased without reducing the gate length 251 over the active silicon regions (causing an increase in leakage power) and without significantly altering the parasitic capacitance.

Figure 5:
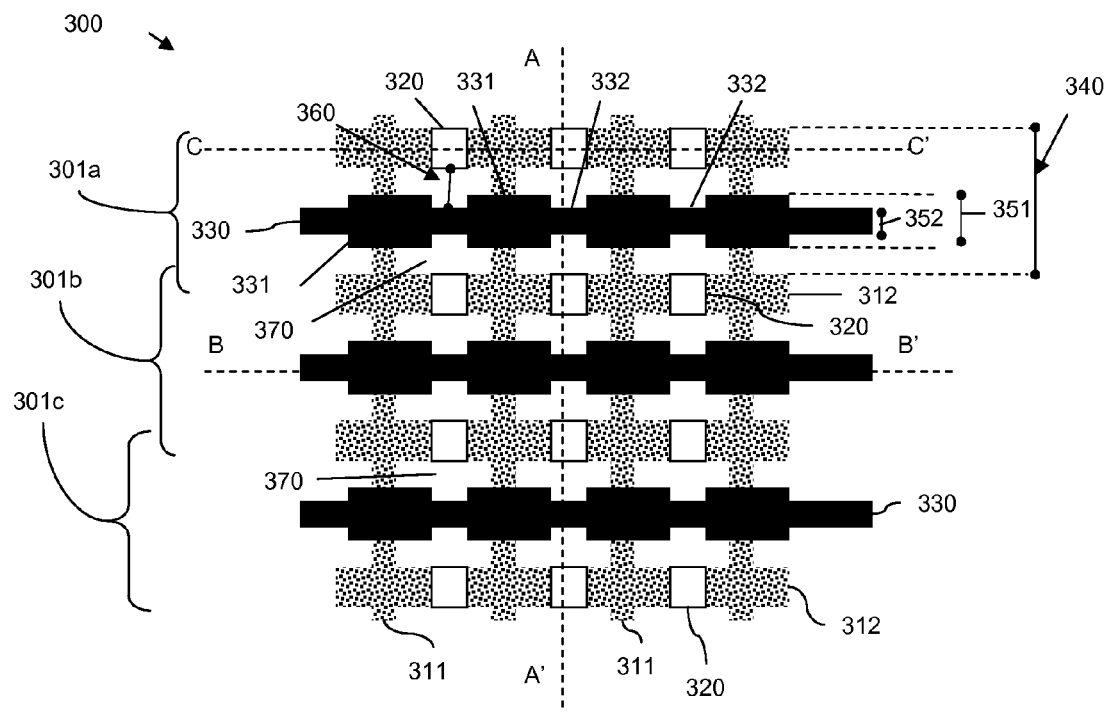
FIG. 5 is a schematic diagram illustrating a top view of another embodiment of the field effect transistor of the invention.
Figure 12:
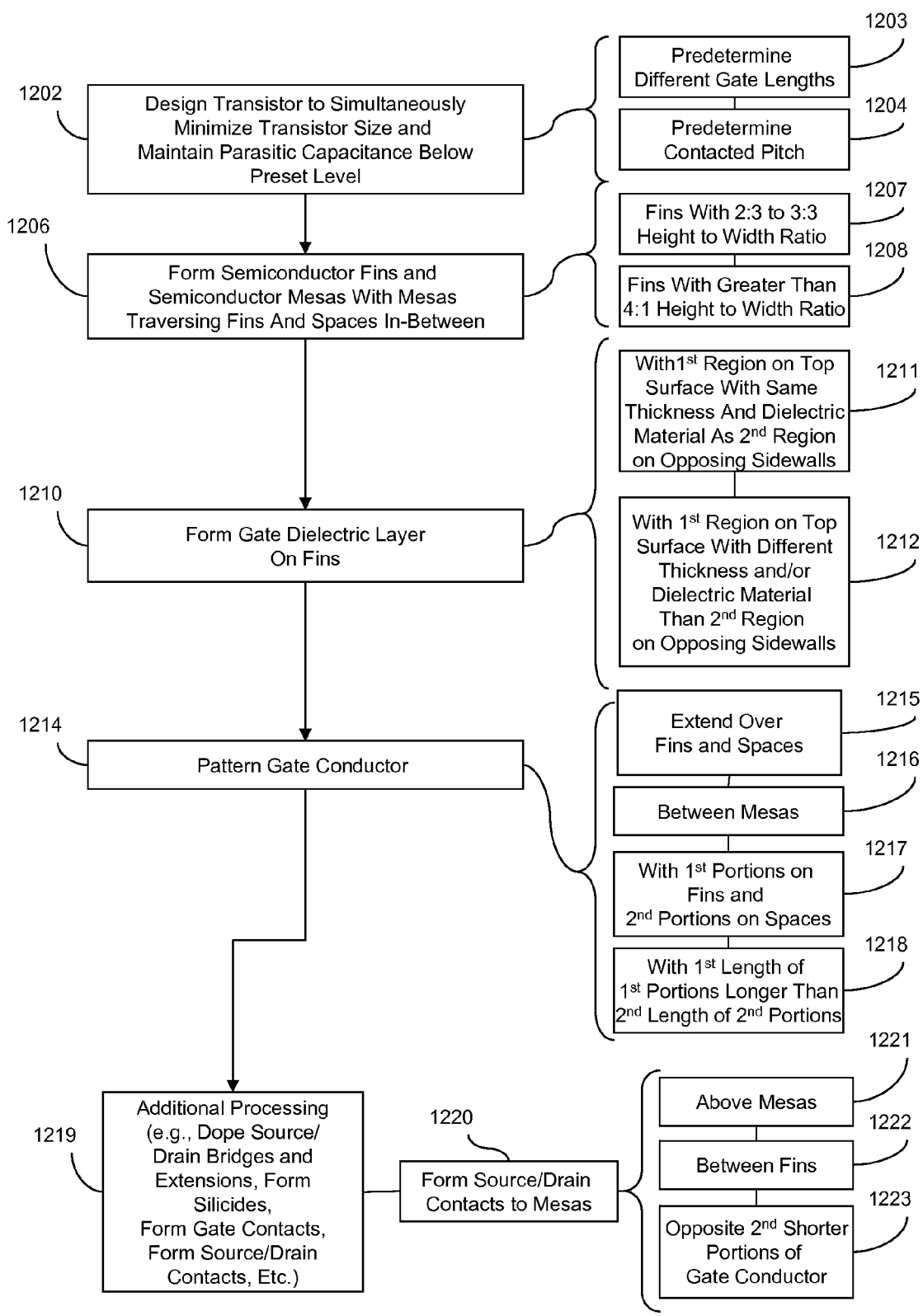
FIG. 12 is a flow diagram illustrating another embodiment of the method of the invention.

Referring to FIG. 12 in combination with FIG. 5, another embodiment of the method comprises forming the non-planar FET 301. The transistor 301 is designed to simultaneously maximize the density of the transistor, minimize leakage power and maintain the parasitic capacitance (e.g., between source/drain contacts 320 and the gate conductor 330) below a preset level, as dictated by performance and density requirements (1202). This is accomplished by predetermining the different lengths 351, 352 of the gate conductor 330 over different sections of the FET (1203) and predetermining the pitch 340 between the contacts 320 (1104), as described in greater detail below. Then, the transistor 301 is formed using conventional processing techniques for non-planar FETs. Specifically, a plurality of first (fin-shaped) semiconductor bodies 311 (i.e., first fins) and a plurality of semiconductor mesas 312 (i.e., second fins) can be lithographically patterned into a silicon layer of a silicon-on-insulator (SOI) or bulk silicon wafer to a buried insulator (e.g., a buried oxide layer) 391 (1206).

As mentioned above, finFETs are non-planar transistors in which the channel region is formed at the center of a thin semiconductor fin with the source/drain regions at opposing ends. Due to the height to width ratio of the finFET fin, the gates are effective only on the opposing sidewalls of the fin and not the top surface. Trigate FETs have a similar structure to that of finFETs; however, the fin height to width ratio is such that the gates are effective on three sides of the channel region, including the top surface and the opposing sidewalls. Thus, in order to form a trigate FET, the semiconductor fins 311 are patterned and etched such that they are formed with a height 313 to width 314 ratio of approximately 2:3 to 3:2 (1207). Alternatively, in order to form a fin-FET, the semiconductor fins 311 are patterned and etched such that they are formed with a height 313 to width 314 ratio that is greater than approximately 4:1 (1208).

Additionally, the first and semiconductor mesas 311-312 are formed such that the semiconductor mesas 312 traverse and contact the semiconductor fins 311 and such that the semiconductor fins 311 and the semiconductor mesas 312 are separated by spaces 370. For example, the semiconductor bodies can be patterned with semiconductor fins 311 parallel to each other, with semiconductor mesas 312 parallel to each other and with the semiconductor fins 311 perpendicular to the semiconductor mesas 312 such that spaces 370 (e.g., rectangular-shaped spaces) are formed between the semiconductor bodies 311-312.

A gate dielectric layer 380 can be formed (e.g., grown or deposited) on the semiconductor fins 311 (1210) (see FIG. 7) and a gate conductor 330 can formed on the gate dielectric layer 380 (1214). Specifically, the gate dielectric layer 380 can be formed with a first region 381 on the top surface of the semiconductor fins 311 and a second region 382 on the opposing sidewalls of the semiconductor fins 311. The first region 381 can be formed with the same thickness and the same dielectric material as the second region 382 (1211, see FIG. 8). Alternatively, using various known techniques, the first region 381 can be formed with a different thickness and/or a different dielectric material (e.g., nitride, oxide, etc.) than the second region 382 (1212, see FIG. 9), e.g., to tune the drive current of a trigate FET.

The gate conductor 330 can be lithographically patterned (at process 1214) over the gate dielectric material 380 on the semiconductor fins 311 between the semiconductor mesas 312 (e.g., parallel to the second sections) such that it extends across the semiconductor fins 311 (i.e., on the top surface and opposing sidewalls of the semiconductor fins 311) and the spaces 370 (1215-1216) (see the cross-sections of FIGS. 6 and 7). The gate conductor 330 can further be patterned with first portions 331 above the semiconductor fins 311 and second portions 332 above the spaces 370 (1217). More particularly, the first portions 331 can be patterned with a first length 351 that is greater than a second length 352 of the second portions 332 (1218). For example, the gate conductor 330 can be formed such that the first length 351 is approximately 1.2 to 2.5 times longer than the second length 352.

A finFET is a non-planar transistor in which the channel region is formed at the center of a thin semiconductor fin with the source/drain regions at opposing ends. Due to the thinness of the fin, the gates are effectively formed only on the opposing sidewalls of the semiconductor fin adjacent to the channel region. A trigate FET has a similar structure to that of finFET; however, the semiconductor fin width and height are such that gates can effectively be formed on three sides of the channel region, including the top surface and the opposing sidewalls Additional processing can be performed in conjunction with the above-described processes, in order to complete the non-planar FETs of this embodiment (1217). This additional processing may include, but is not limited to: doping the source/drain bridges (i.e., the semiconductor mesas 312); doping the source/drain extensions (i.e., the areas of semiconductor fins 311 between the gate conductor 330 and the source/drain bridges 312); forming halos; forming fin spacers adjacent to the semiconductor fins 311; forming spacers on the gate sidewalls; forming silicides (e.g., Co, Ni, Etc.) on the top surface of the semiconductor fins 311, the semiconductor mesas 312, and/or the gate conductor 330 (if the gate conductor is formed with a polysilicon material and without a cap); depositing and planarizing an additional dielectric layer 392; forming gate contacts; and forming the source/drain contacts 320 (i.e., the contacts 320 to the semiconductor mesas 312, as described above).

Figure 10:
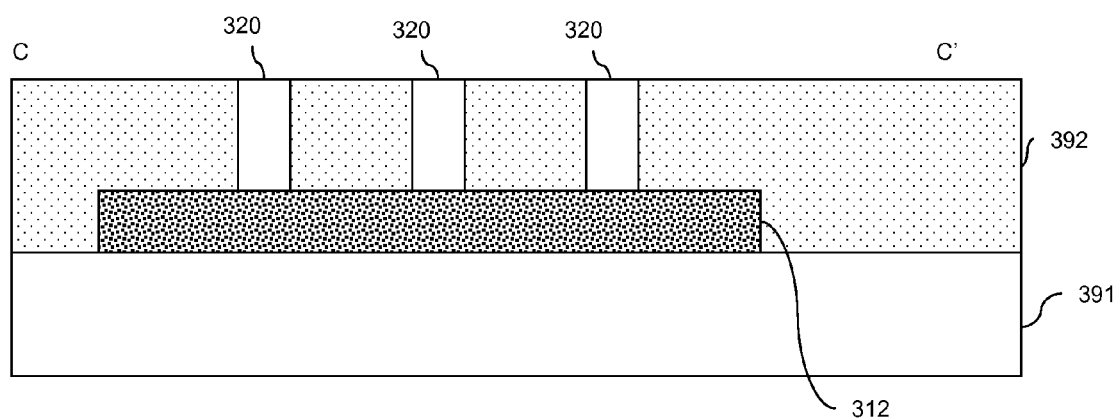
FIG. 10 is a schematic diagram illustrating another cross-section view of the transistor of FIG. 5.

Specifically, a plurality of source/drain contacts 320 can be formed to the semiconductor mesas 312 (1220) (see the cross-sections of FIGS. 6 and 10). These contacts 320 can be formed above the semiconductor mesas 312 (1221) between the semiconductor fins 311 (1222) such that they are opposite the second (shorter) portions 332 (see FIG. 6) and not adjacent to the first (longer) portions 331 of the gate conductor 330 (see FIG. 10) (1223).

As mentioned above (at process 1202), the different lengths 351-352 of the gate conductor 330 and a pitch 340 between the contacts 320 (i.e., a contacted pitch) can be predetermined based on a trade-off between performance and density requirements for the transistor 301 so as to simultaneously maximize the density of the transistor, minimize leakage power and maintain any parasitic capacitance (e.g., between the contacts and the gate conductor) below a preset level. For example, the lengths 351 and 352 of the gate conductor 230 and the pitch 340 can be predetermined during the design phase (1102) to reduce parasitic capacitance without reducing the gate length 351 of over the active silicon regions (causing an increase in leakage power) and without further increasing the contacted pitch 340. Alternatively, the lengths 351 and 352 of the gate conductor 330 and the pitch 340 can be predetermined to allow the device to be increased without reducing the gate length 351 over the active silicon regions (causing an increase in leakage power) and without significantly altering the parasitic capacitance.

Therefore, disclosed above are planar and non-planar field effect transistor (FET) structures and methods of forming the structures. The structures are made up of segmented active devices (e.g., multiple parallel semiconductor fins for a non-planar transistor or multiple parallel semiconductor layer sections for a planar transistor) connected at opposite ends to source/drain bridges. A gate electrode is patterned on the segmented active devices between the source/drain bridges such that it has a reduced length between the segments (i.e., between the semiconductor fins or sections). Source/drain contacts land on the source/drain bridges such that they are opposite only those portions of the gate electrode with the reduced gate length. These FET structures can be configured to simultaneously maximize the density of the transistor, minimize leakage power and maintain the parasitic capacitance between the source/drain contacts and the gate conductor below a preset level, depending upon the performance and density requirements. By decreasing capacitance between the contacts and gates switching speed can be improved and switching power can be decreased. Additionally, by increasing the gate length, manufacturing tolerances can be increased and, hence, device yield can be improved.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A planar field effect transistor comprising:
  a semiconductor layer comprising a plurality of first sections, a plurality of second sections and spaces between said first sections and said second sections, wherein said second sections traverse said first sections;
  a gate conductor extending across said first sections and said spaces,
  wherein said gate conductor comprises first portions over said first sections and having a first length and second portions over said spaces and having a second length, and
  wherein said first length is greater than said second length; and
  a plurality of contacts to said second sections, wherein said contacts are between said first sections and opposite said second portions of said gate conductor.

2. The transistor of claim 1, wherein said first length is approximately 1.2 to 2.5 times longer than said second length.

3. The transistor of claim 1, wherein said first length, said second length and a pitch between said contacts is predetermined in order to simultaneously maximize transistor density, minimize leakage power and maintain parasitic capacitance below a preset level.

4. The transistor of claim 1, wherein said second sections comprise source/drain diffusion regions.

* * * * *